United States Patent [19]

Khan

[11] Patent Number: 4,787,029

[45] Date of Patent: Nov. 22, 1988

[54] LEVEL CONVERTING BUS EXTENDER WITH SUBSYSTEM SELECTION SIGNAL DECODING ENABLING CONNECTION TO MICROPROCESSOR

[75] Inventor: Salim M. Khan, St. Joseph, Ill.

[73] Assignee: GTE Communication Systems Corporation, Phoenix, Ariz.

[21] Appl. No.: 912,304

[22] Filed: Sep. 29, 1986

[51] Int. Cl.[4] .............................................. G06F 13/00
[52] U.S. Cl. ....................................................... 364/200
[58] Field of Search ... 364/200 MS File, 900 MS File

[56] References Cited

U.S. PATENT DOCUMENTS

| | | | |
|---|---|---|---|
| 3,959,775 | 5/1976 | Valassis et al. | 364/200 |
| 4,205,373 | 5/1980 | Shah et al. | 364/200 |
| 4,213,189 | 7/1980 | Mueller et al. | 364/900 |
| 4,313,162 | 1/1982 | Baun et al. | 364/200 |
| 4,404,556 | 9/1983 | Messina | 340/825.03 |
| 4,451,886 | 5/1984 | Guest et al. | 364/200 |
| 4,490,806 | 12/1984 | Enke et al. | 364/734 |
| 4,504,927 | 3/1985 | Callan | 364/900 |
| 4,535,444 | 9/1985 | Falzone et al. | 370/58 |
| 4,593,350 | 6/1986 | Mitchell et al. | 364/200 |
| 4,625,308 | 11/1986 | Kim et al. | 370/104 |
| 4,626,628 | 12/1986 | Ramsavan et al. | 379/284 |
| 4,627,050 | 12/1986 | Johnson | 370/67 |
| 4,710,893 | 12/1987 | McCutcheon | 364/900 |
| 4,750,111 | 6/1988 | Crosby, Jr. et al. | 364/200 |

OTHER PUBLICATIONS

Microcomputers and Microprocessors the 8080,8085 and 780 Programming Interfacing and Trouble Shooting, Uffenbeck, John, Prentice Hall 1985, pp. 630–633.

Primary Examiner—Radlfe B. Zache
Assistant Examiner—Eric Coleman
Attorney, Agent, or Firm—Frank J. Bogacz; Anthony Miologos

[57] ABSTRACT

The bus extender circuit is a least replaceable unit which interfaces between intermodule subsystems and the microprocessor controller of the system. The bus extender circuits are structured so that the subsystem modules may be placed in different power zones. As a result, one subsystem may be powered down without affecting the other subsystems connected to the microprocessor's bus. In addition, the bus extender circuit converts from Fairchild Advanced Schottky TTL logic to high-speed CMOS logic and vice versa and allows bus interface gate arrays located in each subsystem to interface between the subsystem logic and the microprocessor. This bus extender circuit design eliminates the need for strapping options or DIP switches for address decoding.

17 Claims, 1 Drawing Sheet

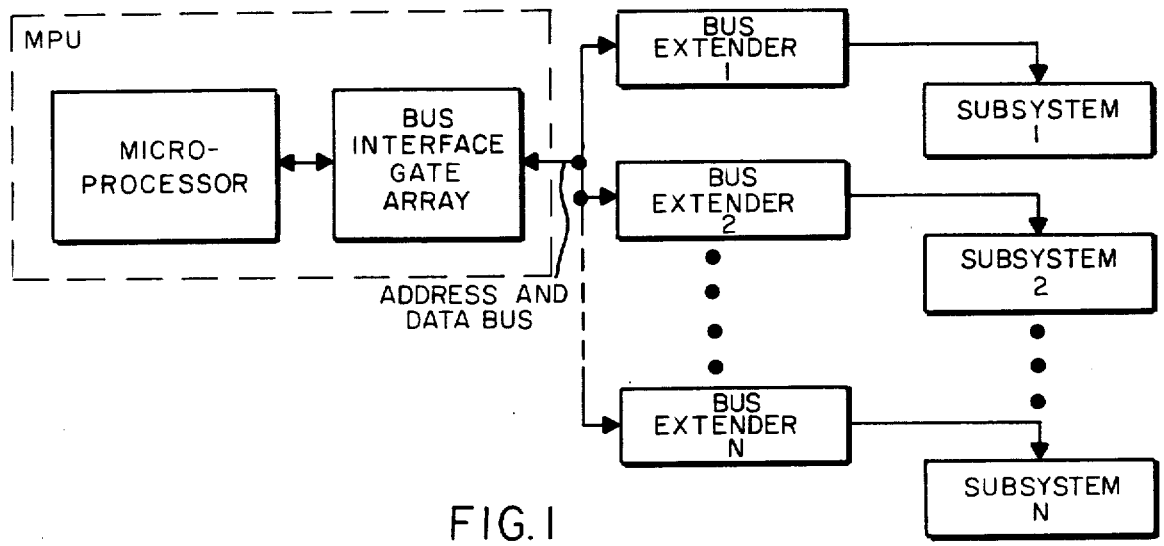
FIG. I
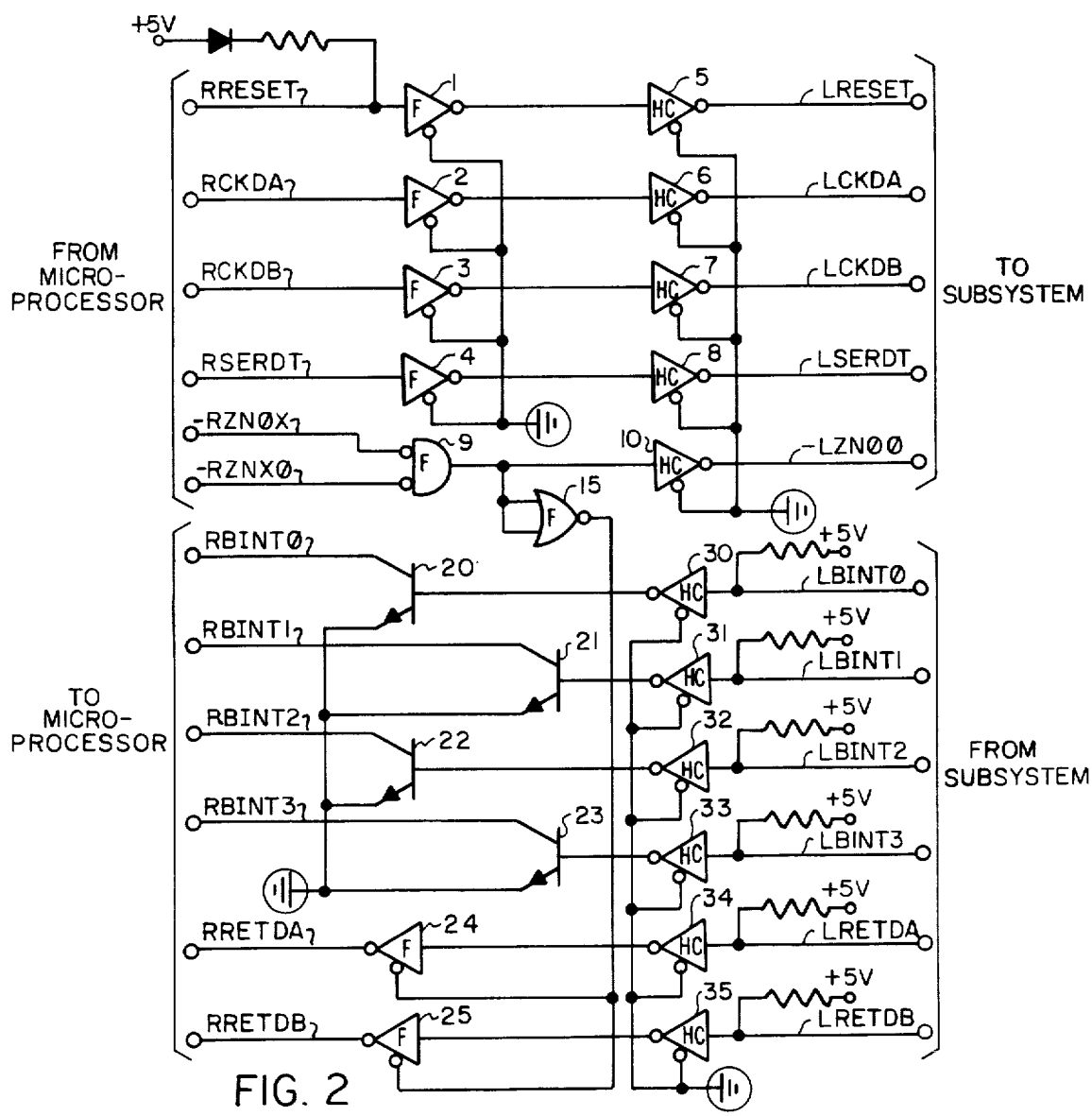
FIG. 2

4,787,029

LEVEL CONVERTING BUS EXTENDER WITH SUBSYSTEM SELECTION SIGNAL DECODING ENABLING CONNECTION TO MICROPROCESSOR

BACKGROUND OF THE INVENTION

The present invention pertains to communication between a microprocessor controller and a plurality of subsystem peripheral and more particularly to a common arrangement for facilitating the transfer of data between the microprocessor and non-compatible peripheral subsystems.

In communication system design, it is necessary for a microprocessor to have the capability of addressing a number of independent subsystems. To achieve this end, subsystems are tied to the data and address buses of the microprocessor. The microprocessor may then address each individual subsystem to transfer data between the microprocessor and subsystem. Each subsystem must recognize its own address, so that only one subsystem responds when a particular address is output by the microprocessor.

Previously, unique addressing was provided by setting dual in line package (DIP) switches to a unique value for each subsystem. When an address was output by the microprocessor, the subsystem logic would decode that address and compare it with the address of the DIP switches in order to enable the subsystem to gain control of the microprocessor's buses. Only one subsystem would contain switches set to each address. Therefore, only the subsystem containing the particular address transmitted by the microprocessor would respond and be enabled on to the microprocessor's buses.

Another method of achieving this unique addressing was to provide strapping options on the backplane of each frame or file of printed wiring cards associated with a particular subsystem. These strapping options would then be wired to sources of logic 0 or logic 1 corresponding to a particular address. When an address was output by the microprocessor, each subsystem would then compare that address with respect to its fixed unique address and respond as outlined above.

The strapping options and DIP switches techniques produce electrical noise, which disrupts the circuit operation. As a result, these options are not reliable. In particular, the DIP switches are fragile and susceptible to breakage.

In addition, subsystem/microprocessor bus architectures are typically dependant upon one common power supply. Subsystems need the ability to be powered down individually without impacting the microprocessor's bus structure.

Lastly, subsystems are typically designed to be directly compatible with the logic inputs and outputs of a microprocessor. Microprocessor bus control units do not typically compensate for the difference in logic levels between microprocessors and their associated peripheral subsystems.

SUMMARY OF THE INVENTION

A microprocessor system includes a bus extender arrangement which is connected between a microprocessor controller and a number of subsystems. The microprocessor controller includes a microprocessor.

The bus extender arrangement has a gate array which is connected to the microprocessor and operates to convert a plurality of signals of the microprocessor from a first to second logic level. This arrangement also includes a bus extender which is connected between the gate array and each of the plurality of subsystems. The bus extender operates to convert the plurality of signals from the second logic level to the first logic level.

Each of the subsystems has a local gate array, which is connectable to the microprocessor, one at a time. When the microprocessor is connected to the subsystem, data may be transferred between the microprocessor and the subsystem to which it is connected. Each subsystem operates in response to selection signals to connect one subsystem to the microprocessor for communication.

A BRIEF DESCRIPTION OF THE DRAWINGS

FIG. 1 is block diagram of a microprocessor system.
FIG. 2 is schematic diagram of a bus extender circuit shown in FIG. 1.

DESCRIPTION OF THE PREFERRED EMBODIMENT

FIG. 1 shows the microprocessor connected to the bus interface gate array (BIGA). The bus interface gate array is connected to a bus extender associated with each subsystem. There may be a number of subsystems, 1 through N.

The microprocessor is required to access each subsystem, one at a time. The microprocessor and each of subsystems are powered by different power supplies, so that different power zones exist throughout the system. Thus, one system may be repaired or taken off line without any adverse effect upon the other subsystems.

The MPU shown in dashed lines in FIG. 1 is a single printed wiring card containing both the microprocessor and bus interface gate array. The microprocessor employs high speed CMOS logic. The BIGA converts the high speed CMOS logic to FAST logic levels. For the high speed CMOS logic the logic "1" input voltage is a minimum of 3.15 volts and the logic "0" input voltage is a maximum of 0.9 volts. For the high speed CMOS logic the output voltages for logic "1" is a minimum of 4.4 volts and the output voltage for a logic "0" is a maximum of 0.1 volts. Other details of CMOS circuits' operation may be found in the High Speed CMOS Data Book, copyright 1984.

For the FAST (Fairchild Advanced Schottky TTL) logic the input voltage for a logic "1" is a minimum of 2.0 volts and the input voltage for a logic "0" is a maximum of 0.8 volts. For the FAST logic the output voltage for a logic "1" is a minimum of 2.7 volts and the output voltage for a logic "0" is a maximum of 0.5 volts. Other details of FAST circuits' operation may be found in the Fairchild Advanced Schottky TTL Data Book, published September, 1984.

Each subsystem is comprised of a number of printed wiring cards which facilitate receiving and transmitting telecommunications data. Each of the printed wiring cards within a subsystem includes on it, a bus interface gate array which produces inputs and outputs compatible with CMOS logic. Once the microprocessor has addressed a particular subsystem, each of the printed wiring cards in that subsystem may communicate with the microprocessor via the bus extender circuit. Each printed wiring card of the subsystem contains a BIGA which controls that printed wiring card's access to the microprocessor bus system.

Each subsystem may be powered down and removed from the bus without effecting the other subsystems remaining connected to the bus. In this way, the power may be zoned to the various subsystems such that system integrity may be maintained despite localized power failures.

Referring to FIG. 2, a circuit embodying the principles of operation of the present invention is shown. The signal shown at the left edge of FIG. 2 are signals transmitted from or to the microprocessor of the MPU via the BIGA. These signals are all prefixed with a "R" to denote this interface. The signals at the right edge of FIG. 2 are transmitted or received from a subsystem. These signals are prefixed with a "L" to denote this. The reset signal RRESET is transmitted from the microprocessor to tri-state gate 1. Gate 1 is connected to tri-state gate 5. Gate 5 then transmits the LRESET signal to the subsystem logic. The clock signals RCKDA and RCKDB are transmitted from the microprocessor through tri-state gates 2 and 3 respectively through tri-states gates 6 and 7 to each subsystem's logic. Serial bit stream data is transmitted via the RSERDT lead to tri-state gate 4. Gate 4 is connected to tri-state gate 8. Gate 8 transmits the LSERDT signal to the subsystem's logic.

Gates 1 through 4 may comprise Fairchild Advanced Schottky TTL (FAST) gates part number FAST74240. Tri-state gates 5 through 8 may comprise high speed CMOS logic (HCMOS) gates part number HC74240.

Addressing signals RZNOX and RZNXO are transmitted from the microprocessor to NAND gate 9. NAND gate 9 may comprise a FAST logic device part number FAST 7430.

Eight address bits are output from the microprocessor to enable up to 4 subsystems to be decoded. This scheme is obviously applicable to more then 4 subsystems by providing more address lines for decoding. These 8 leads are designated RZNX0, RZNX1, RZNX2, RZNX3, RZN0X, RZN1X, RZN2X and RZN3X. FIG. 2 shows a bus extender with NAND gate 9 being connected to the first 2 leads RZNOX and RZNXO. The other 3 subsystems would be connected to corresponding leads, 1 from each group. For example, subsystem 2 would have its NAND gate 9 connected to RZNX1 and RZN1X, etc.

When RZN0X and RZNX0 are both low, gate 9 is enabled and produces the decode for that particular subsystem which is transmitted through gate 10 to subsystem via lead LZNOO. Gate 10 is also a high speed CMOS tri-state gate and may be implemented with part number HC74240.

Gates 1 through 4 and 5 through 8 are tri-state devices which are constantly enabled by their connection to electrical ground. However, only the subsystem which has decoded its particular address will enable its BIGA to be connected to the bus extender to receive and transmit data.

NOR gate 15 is connected to NAND gate 9 and to FAST tri-state gates 24 and 25. NOR gate 15 serves to enable the tri-state devices to transmit serial data from the particular subsystem to microprocessor via the RRETDA and RRETDB leads. Tri-state gate 34 is connected between gate 24 and the particular subsystem via the LRETDA lead. Similarly, tri-state gate 35 is connected between gate 25 and the particular subsystem via the LRETDB lead. Serial data may be transmitted from the subsystem to microprocessor via these two leads.

Four interrupts may be transmitted from each subsystem to the microprocessor. These interrupts serve to signal the microprocessor that various subsystem equipment needs servicing or maintenance. Interrupt leads LBINT0 through LBINT3 are connected between each pariicular subsystem and tri-state gates 30 through 33 respectively. Tri-state gates 30 through 33 are connected to NPN switching transistors 20 through 23, respectively. The collector of transistors 20 through 23 are respectively connected to the microprocessor via leads RBINT0 through RBINT3. The tri-state input of gates 30 through 35 are each connected to ground, thereby permanently enabling the interrupt and serial data leads. However, only the subsystem addressed may respond on these leads.

Gates 30 through 35 may be implemented using high speed CMOS tri-state gates part number HC74240. Gates 24 and 25 may be implemented using FAST tri-state gates part number FAST 74240. Gate 15 may be implemented with a NOR gate FAST 7402.

Although the preferred embodiment of the invention has been illustrated, and that form described in detail, it would be readily apparent to those skilled in the art that various modifications may be made therein without departing from the spirit of the invention or from the scope of the appended claims.

What is claimed is:

1. In a microprocessor system, a bus extender arrangement is connected between a microprocesor controller and a plurality of subsystems, said bus extender arrangement comprising:

said microprocessor controller including microprocessor means;

first gate array means connected to said microprocessor means for converting a plurality of signals of said microprocessor means from a first logic level to a second logic level;

bus extender means including a plurality of bus extender circuit means, each bus extender circuit means including first level converting means connected between said first gate array means and said corresponding subsystem for converting said plurality of signals from said first to said second logic level, and second level converting means connected between said corresponding subsystem and said first gate array means for converting said plurality of signals from said second logic level to said first logic level;

said plurality of subsystems each including second gate array means, and each subsystem connected via said corresponding bus extender circuit means to said microprocessor means, one at a time, for transferring data between said microprocessor means and one of said subsystems;

selection signal means connected between said first gate array means and said bus extender means for addressing one of said plurality of subsystems; and each of said bus extender circuit means further including decoding means connected to said first gate array means, said corresponding subsystem and to said second level converting means, said decoding means operated in response to said operation of said selection signal means to enable said corresponding subsystem to connect to said microprocessor means.

2. A bus extender arrangement as claimed in claim 1, said first level converting means including:

first gating means connected to said first gate array means for transmitting a plurality of signals of said microprocessor means of said first logic level; and second gating means connected between said first gating means and said corresponding subsystem for converting said plurality of signals of said first logic level to said second logic level.

3. A bus extender arrangement as claimed in claim 2, said second level converting means including:

third gating means connected to said second gate array means of said corresponding subsystem for transmitting a plurality of signals of said subsystem of said second logic level;

fourth gating means connected between said third gating means and said first gate array means for converting at least one of said signals of said subsystem from said second logic level to said first logic level; and third level converting means connected between said third gating means and said first gate array means for converting at least one of said plurality of signals of said subsystem to said first logic level.

4. A bus extender arrangment as claimed in claim 3, said decode means including:

fifth gating means connected to said first gate array means for decoding said address of said selection signal means;

sixth gating means connected between said fifth gating means and said fourth gating means for enabling said signals of said fourth gating means; and seventh gating means connected between said fifth and sixth gating means and said second gate array means of said corresponding subsystem for producing a selection signal for enabling said corresponding subsystem.

5. A bus extender arrangement as claimed in claim 4, said first gating means including a plurality of tri-state Fairchild Advanced Schottky TTL gates.

6. A bus extender arrangement as claimed in claim 4, said second gating means including a plurality of tri-state, high-speed CMOS gates.

7. A bus extender arrangement as claimed in claim 4, said third gating means including a plurality of tri-state, high-speed CMOS gates.

8. A bus extender arrangement as claimed in claim 4 said fourth gating means including a plurality of tri-state Fairchild Advanced semiconductor TTL gates.

9. A bus extender arrangement as claimed in claim 4, said third level converting means including a plurality of NPN switching transistor devices.

10. A bus extender arrangement as claimed in claim 4, said fifth gating means including at least one Fairchild Advanced Schottky TTL NAND gate.

11. A bus extender arrangement as claimed in claim 4, said sixth gating means including at least one Fairchild Advanced Schottky TTL NOR gate.

12. A bus extender arrangement as claimed in claim 4, said seventh gating means including at least one tri-state, high-speed CMOS gate.

13. A bus extender arrangement as claimed in claim 5, wherein said plurality of Fairchild Advanced Schottky TTL tri-state gates each include a connection to electrical ground.

14. A bus extender arrangement as claimed in claim 6, wherein each of said tri-state, high-speed CMOS gates includes a connection to electrical ground.

15. A bus extender arrangement as claimed in claim 7, wherein each of said plurality of high-speed, tri-state CMOS gates includes a connection to electrical ground.

16. A bus extender arrangement as claimed in claim 9, wherein each of said NPN switching transistors includes a connection to electrical ground.

17. A bus extender arrangement as claimed in claim 4, said selection signal means including a plurality of address leads from said microprocessor means.

* * * * *